United States Patent [19]

Iranmanesh

[11] Patent Number: 5,124,775

[45] Date of Patent: Jun. 23, 1992

[54] SEMICONDUCTOR DEVICE WITH OXIDE SIDEWALL

[75] Inventor: Ali A. Iranmanesh, Federal Way, Wash.

[73] Assignee: National Semiconductor Corporation, Santa Clara, Calif.

[21] Appl. No.: 557,446

[22] Filed: Jul. 23, 1990

[51] Int. Cl.⁵ .............................................. H01L 27/02
[52] U.S. Cl. ......................................... 357/43; 357/49; 357/34; 357/55
[58] Field of Search ........................ 357/43, 49, 34, 47, 357/50, 55

[56] References Cited

U.S. PATENT DOCUMENTS

| | | | |
|---|---|---|---|
| 4,274,909 | 6/1981 | Venkataraman et al. | 357/49 X |
| 4,333,227 | 6/1982 | Horng et al. | 29/580 |
| 4,621,414 | 11/1986 | Iranmanesh | 29/576 |
| 4,641,416 | 2/1987 | Iranmanesh et al. | 29/576 |
| 4,745,087 | 5/1988 | Iranmanesh | 437/69 |
| 4,800,171 | 1/1989 | Iranmanesh et al. | 437/31 |
| 4,926,233 | 5/1990 | Hutter | 357/43 |
| 4,929,570 | 5/1990 | Howell | 357/43 X |

*Primary Examiner*—William Mintel
*Assistant Examiner*—Roy Potter
*Attorney, Agent, or Firm*—Townsend and Townsend

[57] ABSTRACT

A semiconductor device and method to reduce the size of bipolar transistors and decrease the number of steps required to fabricate the bipolar transistor by using a unitary contiguous oxide sidewall to separate a collector contact from the base, emitter and emitter contact. The device and method may also be used during the fabrication of BiCMOS devices.

5 Claims, 10 Drawing Sheets

SEMICONDUCTOR DEVICE WITH OXIDE SIDEWALL

BACKGROUND OF THE INVENTION

The present invention relates to the field of semiconductor devices and their manufacture. More specifically, in one embodiment, the invention provides improved bipolar devices in a process which also provides complementary metal-oxide (CMOS) semiconductor devices and a process for their fabrication.

Bipolar and CMOS devices and their fabrication have been well known for many years. Many techniques have been used to reduce the size of a bipolar transistor and decrease the number of steps required to fabricate the bipolar transistor. For example, bipolar transistors are generally fabricated with the emitter, base, and collector formed in a vertical rather than horizontal sequence. While this generally decreases the size of a bipolar transistor, more steps and space are generally required to provide electrical contacts to each of the elements of the bipolar transistor. In particular, field oxide regions between the base and collector of such transistors presently increase the area of such transistor substantially.

Recently, the advantages of bipolar and CMOS devices have been beneficially incorporated into circuits using both types of devices on a single substrate. Circuits which incorporate both bipolar and CMOS devices have come to be known as "BiCMOS." BiCMOS devices offer the advantages of the high packing density and low power consumption of CMOS devices, as well as the high speed of bipolar devices. However, techniques used to reduce the size of the bipolar transistor and decrease the number of steps required to fabricate the bipolar transistor are many times incompatible or difficult to use with the fabricating of a BiCMOS device. One BiCMOS device and process for fabrication thereof is described in U.S. Pat. No. 4,764,480 (Vora), assigned to the assignee of the present invention and incorporated herein by reference for all purposes.

From the above it is seen that improved bipolar or BiCMOS devices and method of fabrication thereof is desired not only to provide devices with improved performance and reduced size, but also to provide devices which can be fabricated more quickly and economically.

SUMMARY OF THE INVENTION

The present invention provides a semiconductor device and method of fabrication which reduce the size of bipolar transistors and decrease the number of steps required to fabricate the bipolar transistor by using a unitary contiguous oxide sidewall to separate a collector contact from the base, emitter and emitter contact. The device and method may also be beneficially used in some embodiments in conjunction with BiCMOS devices.

In one embodiment, the invention provides a bipolar transistor comprising a collector region having a first conductivity type; a base having a second conductivity type located above the collector region; an emitter having a first conductivity type located above the base; a trench extending along a sidewall of the emitter, base and collector; and a first unitary contiguous dielectric sidewall to the emitter, base and collector in the trench. By "unitary contiguous dielectric sidewall" it is intended to mean herein a sidewall oxide formed on a sidewall of a trench which has resulted from a single trenching step through the emitter, base, and (optionally) a portion of the collector.

A further understanding of the nature and advantages of the invention may be realized by reference to the remaining portions of the specification and the attached drawings.

DESCRIPTION OF THE PREFERRED EMBODIMENTS

General

Figure 1:
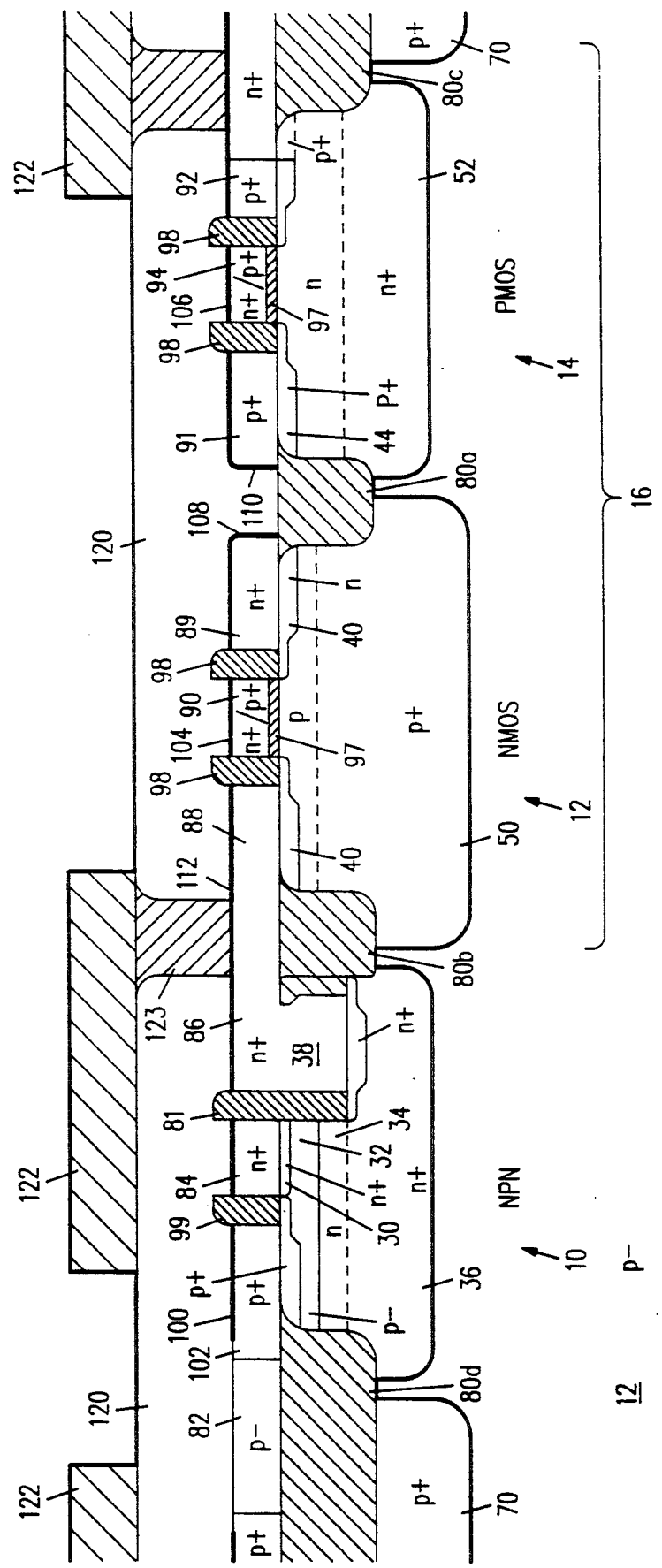
FIG. 1 is a cross-section of a BiCMOS structure according to one embodiment of the invention.

FIG. 1 is a cross-section of a BiCMOS device according to one embodiment of the invention. The device includes a bipolar transistor 10 (which in the embodiment shown in FIG. 1 is an NPN transistor), an n-channel MOSFET (NMOS transistor) 12 and a p-channel MOSFET (PMOS transistor) 14. It should be recognized that while the invention is illustrated herein in a BiCMOS device, the invention is not so limited. The device and method herein will find application in a variety of semiconductor structures including those with only bipolar transistors.

NMOS transistor 12 and PMOS transistor 14 are appropriately connected to form a CMOS structure 16. The devices are fabricated on a substrate 18. In the embodiment shown in FIG. 1, substrate 18 is a p-substrate having a dopant concentration of between about $1 \times 10^{13}$ and $1 \times 10^{16}/cm^3$, with a preferred range of between $2 \times 10^{14}$ and $3 \times 10^{15}/cm^3$. A reduced pressure doped n-type epitaxial silicon layer is grown on top of the substrate for use in fabricating the devices. Although the invention is illustrated in the figures herein as including an epitaxial layer and a buried layer, the improved geometry of the device disclosed herein will in some embodiments eliminate the need for the formation of a buried layer and/or overlying epitaxial layer due to its reduced size. According to these embodiments, the devices would be formed directly on the substrate.

NPN transistor 10 is provided with an emitter 30, base 32, and a collector 34. A heavily doped buried layer 36 provides a low resistance connection region between collector 34 and a collector contact 38. In preferred embodiments buried layer 36 is doped to a concentration of about $10^{20}/cm^3$.

In most embodiments, the NMOS transistor 12 has a source and drain regions 40 formed in a p+ tub or well 50. PMOS transistor 14 has a source drain regions 44 formed in an n+ tub or well 52. In the preferred embodiment, the p+ well 50 is doped to a concentration of between about $1 \times 10^{16}$ and $1 \times 10^{18}$, with a preferred range at about $5 \times 10^{16}$ and $7 \times 10^{17}/cm^3$. The n+ well 52 is doped to a concentration of between $1 \times 10^{16}$ and $2 \times 10^{19}/cm^3$ with a preferred range of about $2 \times 10^{17}$ and $5 \times 10^{17}/cm^3$, although a wide range of dopant concentrations may be used without departing from the scope of the invention. Wells 50 and 52 enable CMOS 16 to be formed on a single substrate.

P+ channel stops 70 are provided between the NPN transistor and adjacent devices to prevent surface inversion of the lightly doped substrate which would contact the buried layer 36 with adjacent devices. Between the NMOS transistor and the PMOS transistor, between the NMOS transistor and the NPN transistor, and between the bipolar transistor shown in FIG. 1 and adjacent devices, oxide isolation regions 80a, 80b, 80c, and 80d, respectively, are provided which typically will be, for example, SiO$_2$ for device isolation.

Sidewall oxide region 81 separates emitter contact 84 and collector contact 86. Sidewall oxide region 81 also separates collector 34 and the recessed portion of collector contact 38. By using a sidewall oxide region rather than a conventional field oxide region to separate the emitter/base and collector contact of the device, significantly reduced transistor geometry can be achieved.

Along the surface of the device are a resistor 82, base contact 102, emitter contact 84, collector contact 86, NMOS source contact 88, NMOS drain contact 89, NMOS gate 90, PMOS drain contact 91, PMOS source contact 92, and PMOS gate 94. Thin gate oxide layers 97 are provided under the NMOS and PMOS transistor gates and sidewall oxide 98 is provided on the sidewalls of the NMOS and PMOS gates. In the preferred embodiments, the NMOS gate 90 is formed of heavily doped n+ silicon while the PMOS gate 94 is formed from n+ or p+ polysilicon, with n+ preferred because n+ will provide a buried channel device while p+ will provide a surface channel device. Sidewall oxide regions 81 and 99 are also provided on the sidewall of the bipolar emitter.

A refractory metal silicide contact 100 is formed on a p+ bipolar transistor base contacts 102. A separate silicide contact 104 is provided along the top portion of the emitter contact 84 between the sidewall spacer oxide regions 81 and 99. Similarly, silicide contacts are provided for collector contact 38, NMOS source contact 88, NMOS drain contact 89, NMOS gate 90, PMOS drain contact 91, PMOS gate 94, and PMOS source contact 92. Similar to the contact for the emitter 32, the silicide contacts 104 and 106 for the NMOS and PMOS gates, respectively, extend only from sidewall oxide to sidewall oxide. Conversely, the silicide contacts 108 and 110 for the NMOS and PMOS transistors also cover the sidewall of the polysilicon contacts and extend along the horizontal portion of the source/drain up to the sidewall oxide of the gates 90 and 94. The silicide contact 112 for the collector contact covers from the sidewalls of the emitter sidewall oxide to sidewall oxide region 98 along the upper surface of the collector. The structure further includes a thick (0.8 to 1.3 and preferably about 1.3 μm) oxide layer 120 to insulate the devices from metal layer 122, used for interconnection purposes. Tungsten plugs 123 may be used to fill the contact apertures in the oxide layer 120.

Fabrication Sequence of a BiCMOS Device

Figure 2A:
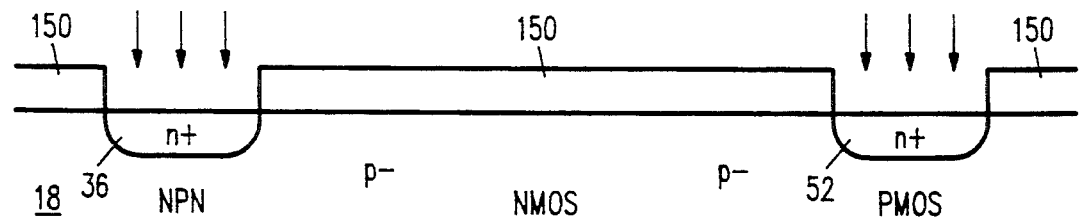
FIGS. 2a–2z illustrate fabrication of a BiCMOS device according to the present invention.
Figure 2B:
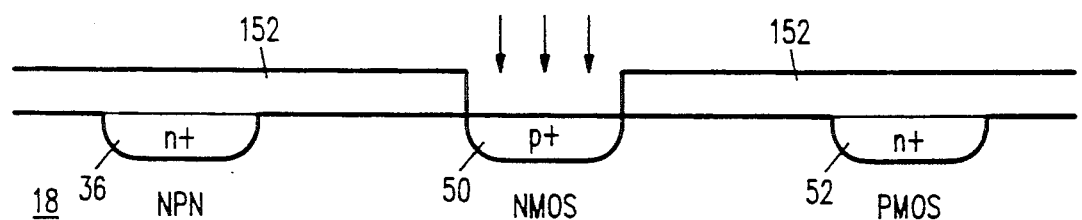
Figure 2C:
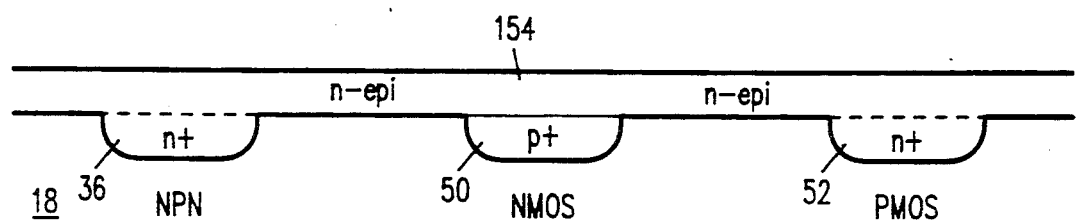
Figure 2D:
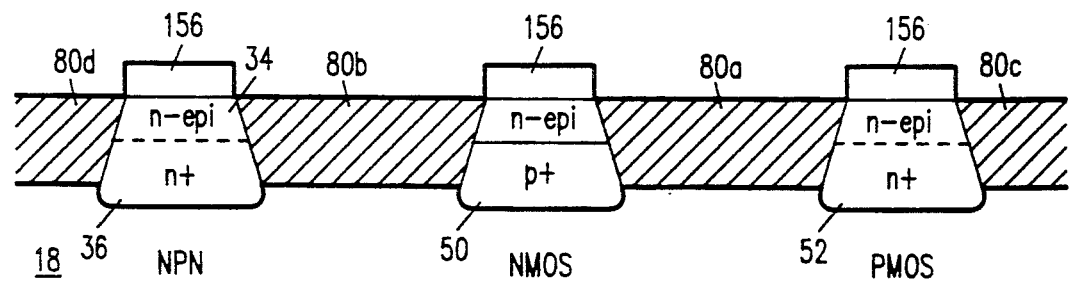
Figure 2E:
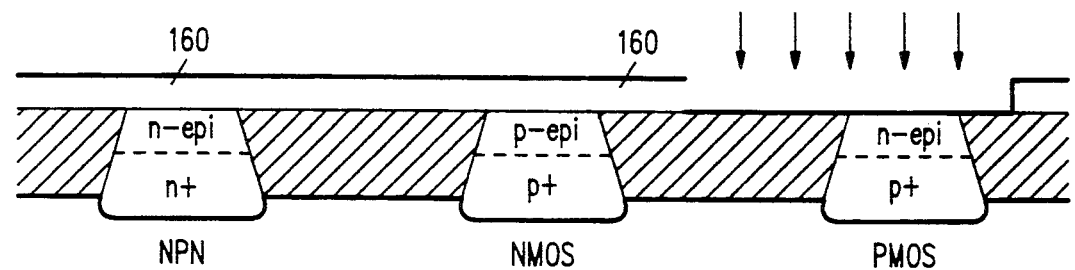
Figure 2F:
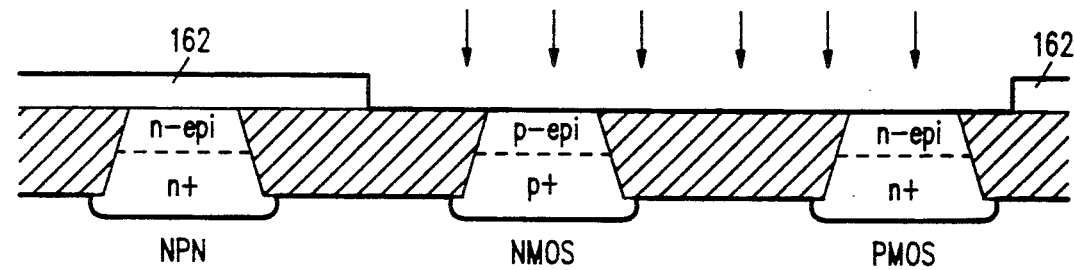
Figure 2G:
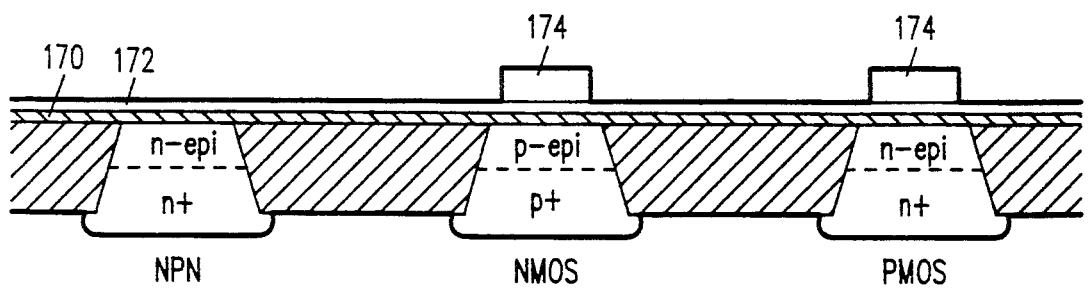
Figure 2H:
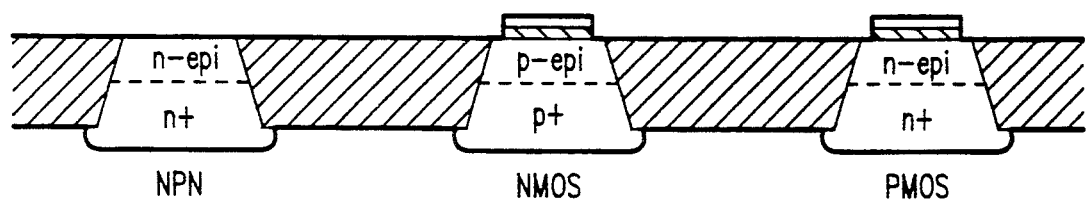
Figure 2I:
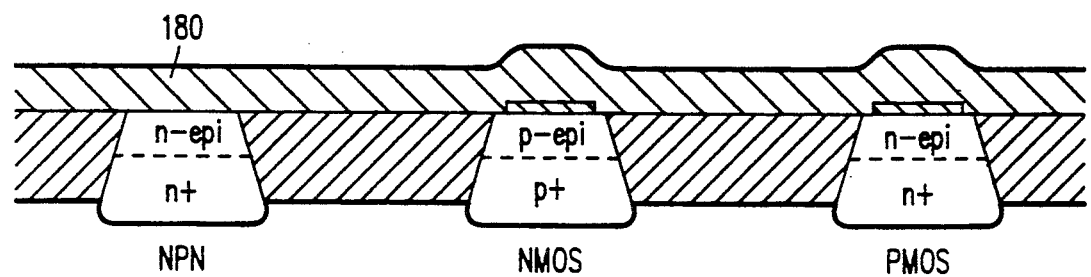
Figure 2J:
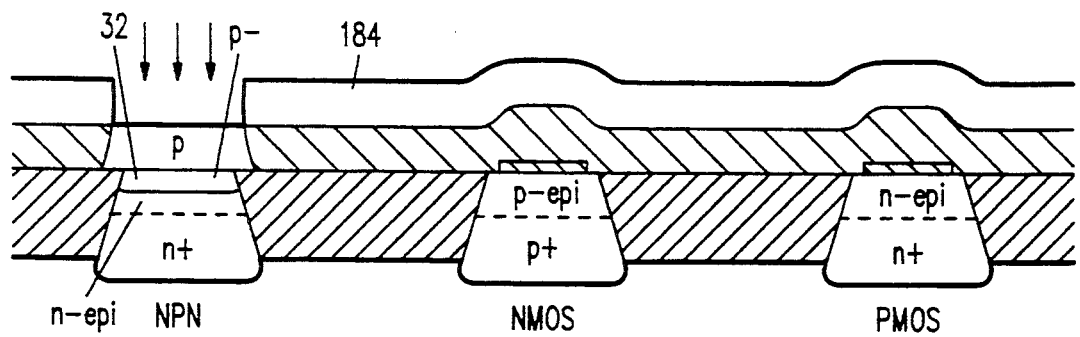
Figure 2K:
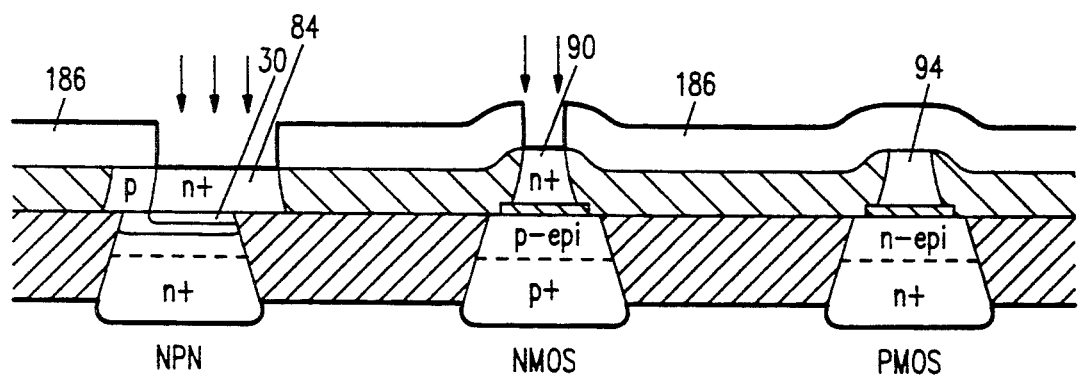
Figure 2L:
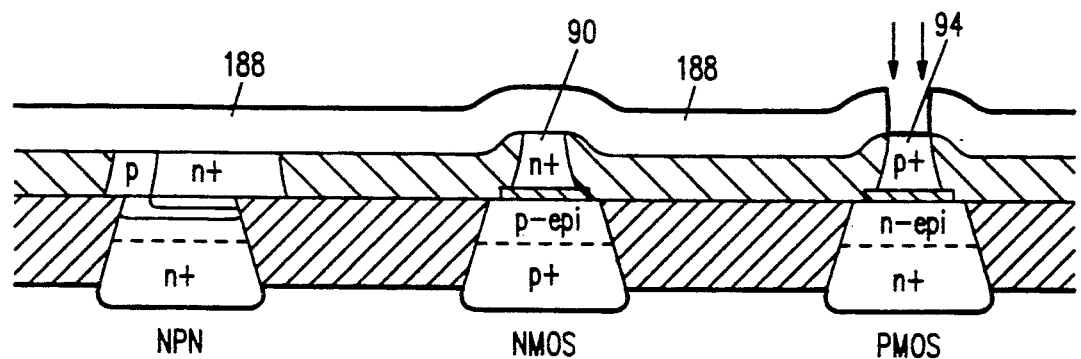
Figure 2M:
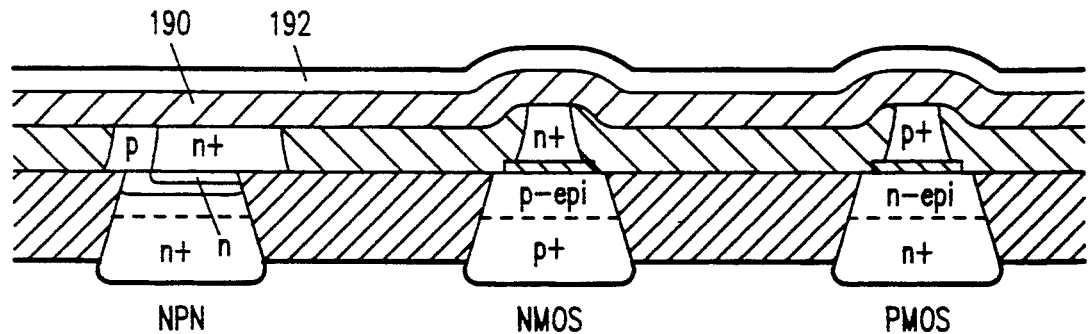
Figure 2N:
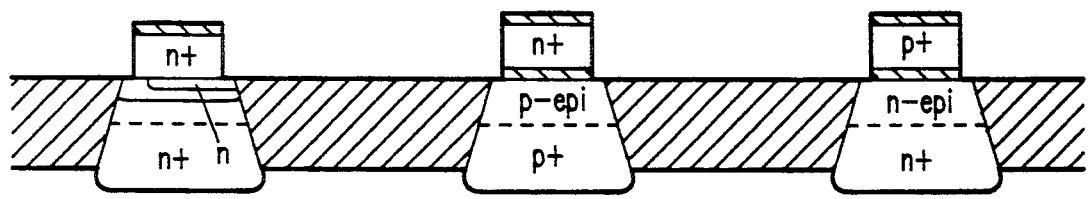
Figure 2O:
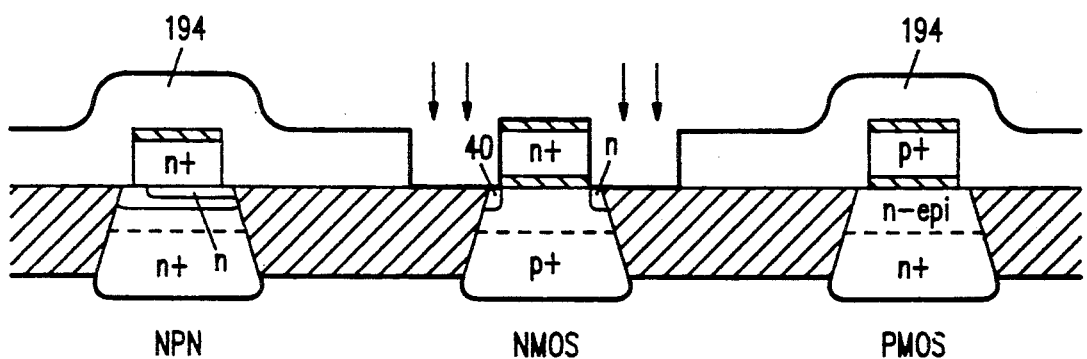
Figure 2P:
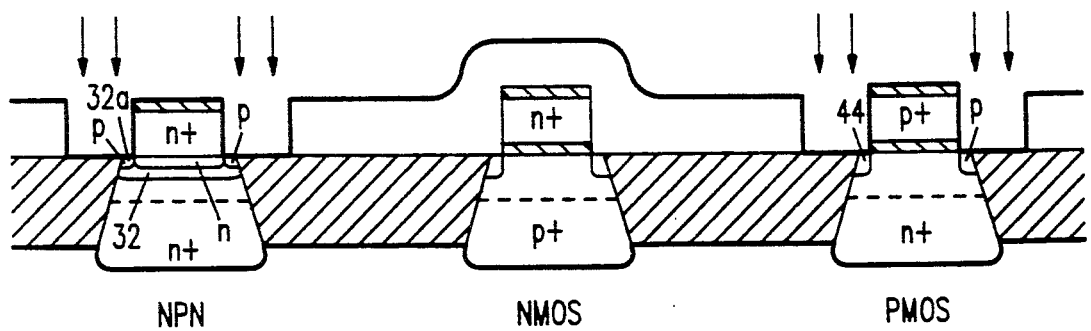
Figure 2Q:
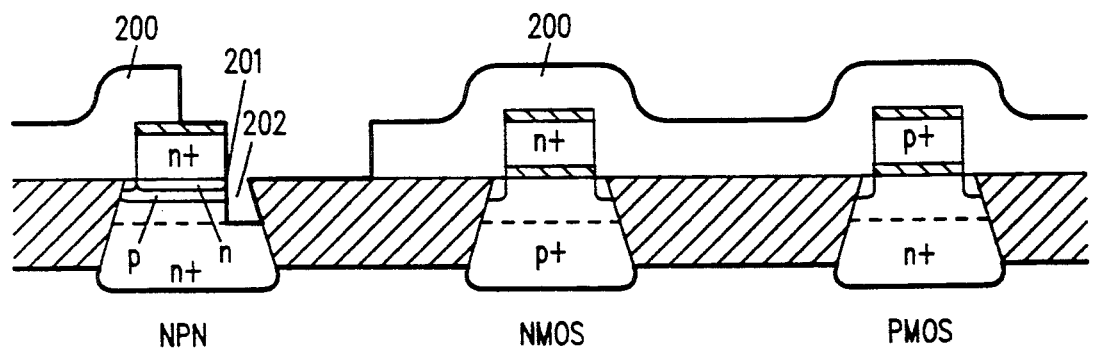
Figure 2R:
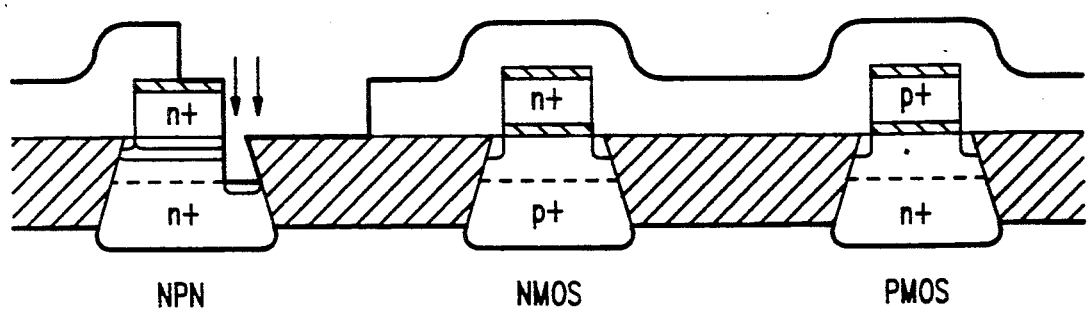
Figure 2S:
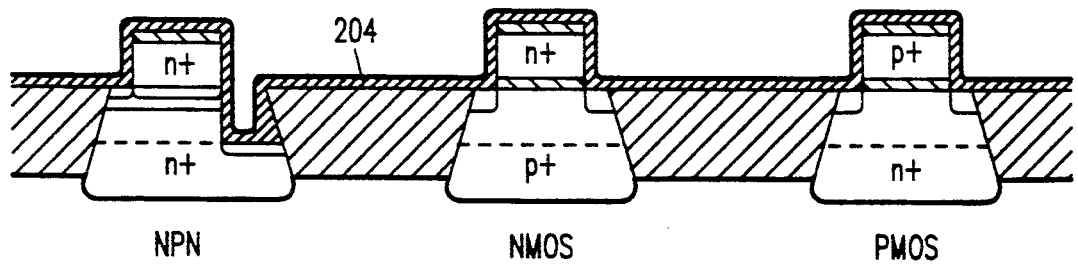
Figure 2T:
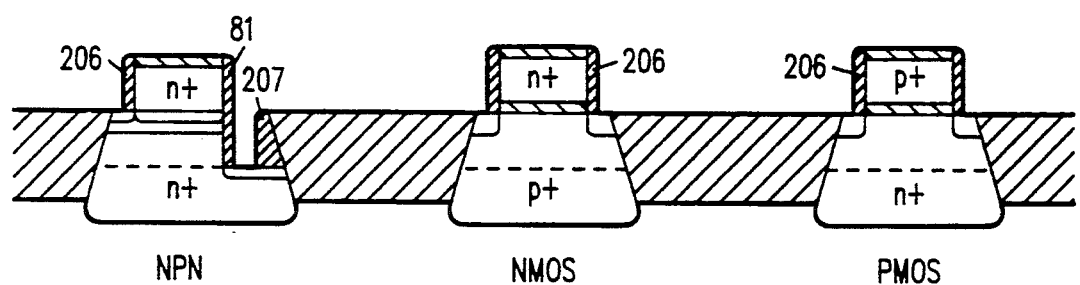
Figure 2U:
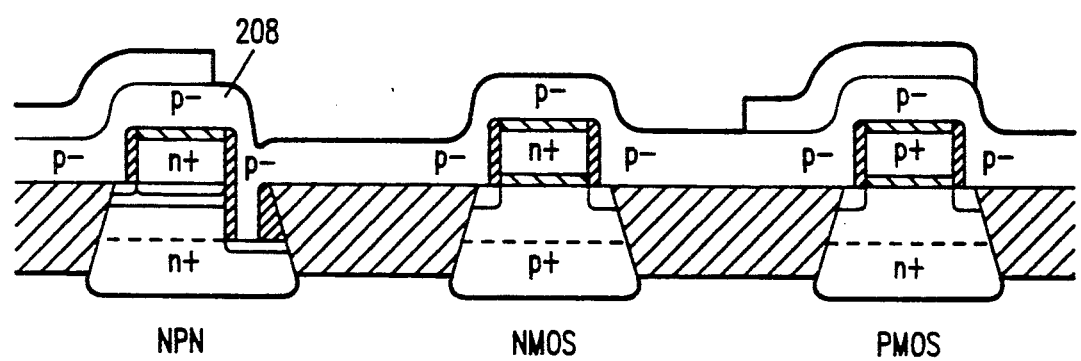
Figure 2V:
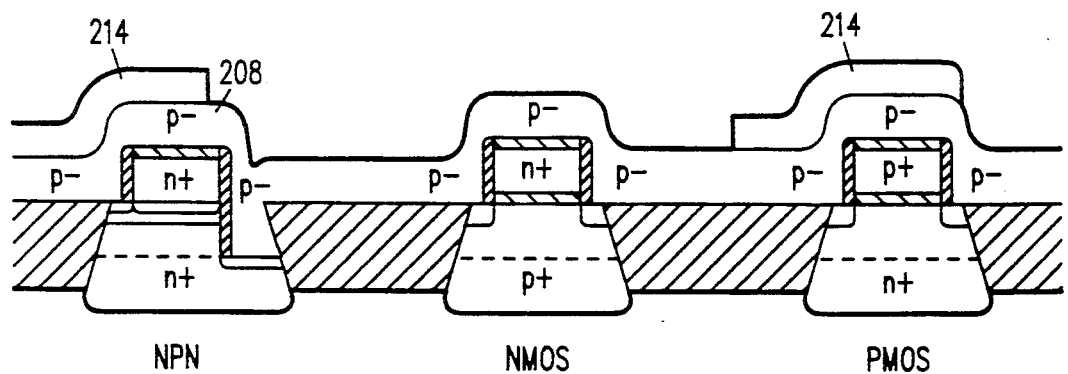
Figure 2W:
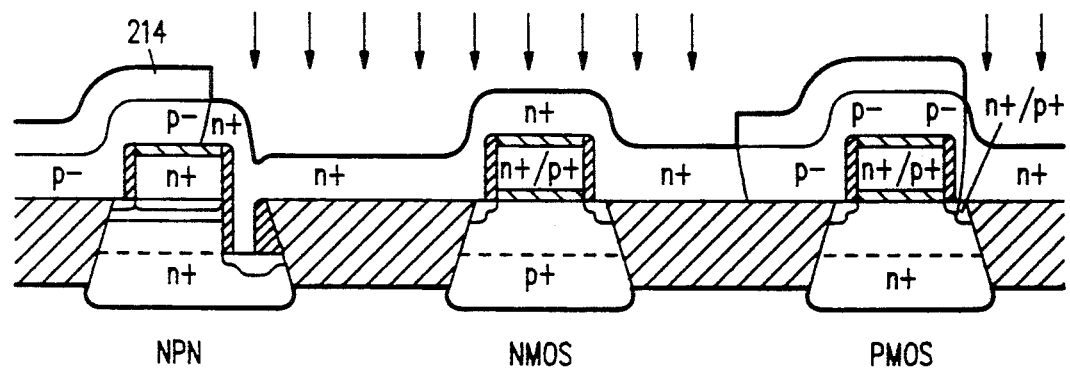
Figure 2X:
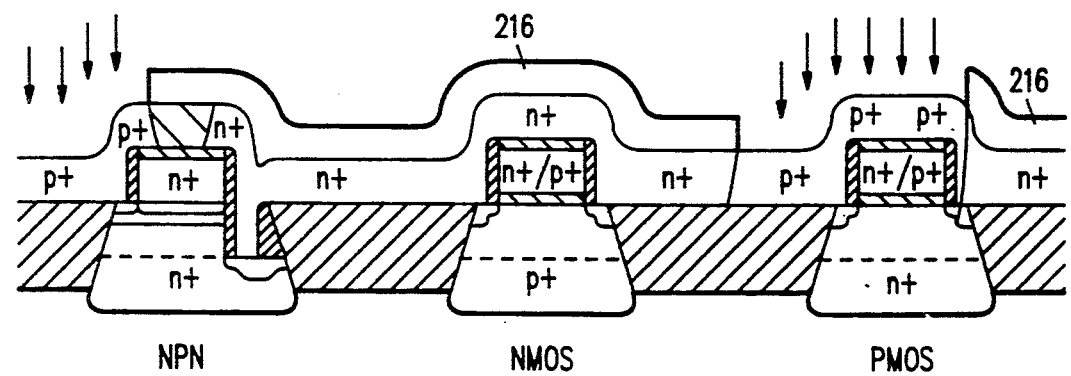
Figure 2Y:
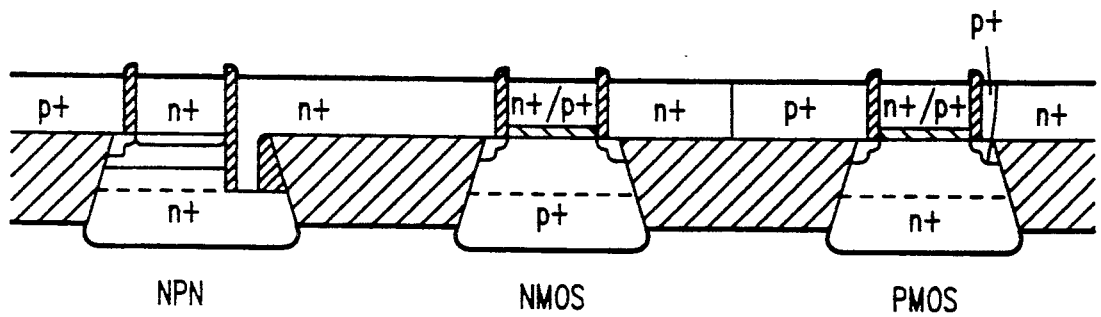
Figure 2Z:
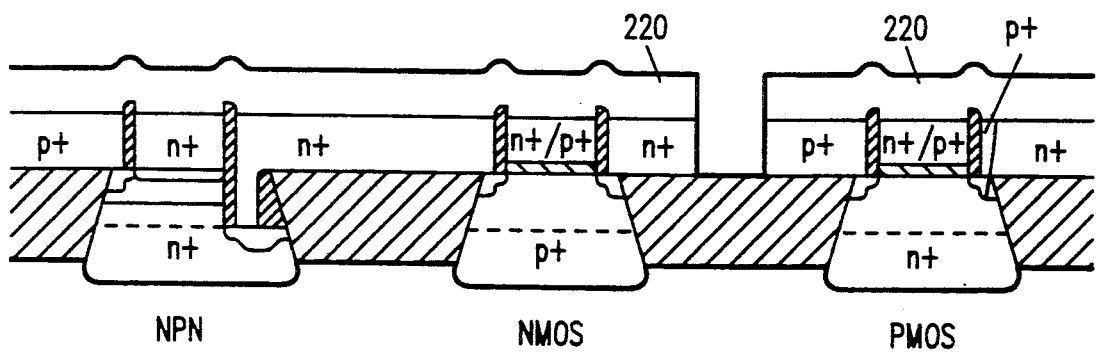

FIGS. 2a through 2z illustrate fabrication of the BiCMOS devices shown in FIG. 1.

FIG. 2a illustrates a cross-section of the devices at a first stage of their fabrication. The substrate is masked by photoresist 150 for simultaneous formation of the n+ buried layer 36 and the PMOS n+ buried layer 52 with arsenic, antimony, or the like. The implant energy used for formation of 36 and 52 is preferably about 100 to 200 keV with a preferred range of between about 120 to 180 keV with a dopant concentration of regions 36 and 52 between about $5 \times 10^{17}$ to $2 \times 10^{20}$ with a preferred range of about $1 \times 10^{19}$ and $1 \times 10^{20}/cm^3$.

After formation of the n+ regions 36 and 52, the device will be processed in an oxidation cycle to drive in n+ impurity and create a "step" which can be used for alignment of subsequent layers. Thereafter, the device is masked by photoresist 152 for formation of the NMOS p+ buried layer 50, as shown in FIG. 2b. The implant energy used in formation of region 50 is preferably between about 100 to 200 keV with a preferred range of 50 to 100 keV such that the dopant concentration of the p+ buried layer is between about $1 \times 10^{17}$ and $1 \times 10^{18}/cm^3$. The p+ region 50 is preferably doped with boron.

As shown in FIG. 2c, the photoresist mask 152 is then removed and a lightly doped n-type epitaxial silicon layer 154 having a thickness of about 1.1 μm is grown across the surface of the substrate. After depositing sandwiched layers of oxide and nitride, a photoresist mask 156 is then formed over the surface so as to define oxide regions 80a, 80b, 80c, and 80d and epitaxial regions 34, as shown in FIG. 2d. The oxide regions are formed using, for example, the well known "SWAMI" process. Alternatively, the field oxide regions are formed according to the methods described in U.S. application Ser. No. 502,943 (Attorney Docket No. 8332-237) which is incorporated herein by reference for all purposes.

As illustrated in FIG. 2e, a mask 160 is formed on the surface of the substrate which exposes only the NMOS transistor region. This mask is used for implanting the n-type well region for the PMOS transistor. An implant energy of 100 to 190 keV is used with a dose of between $1 \times 10^{14}$ and $1 \times 10^{16}$ using phosphorous or arsenic as a dopant. The resulting dopant concentration in the channel region is between about $10^{17}$ and $10^{18}/cm^3$.

A mask 162 is then formed on the surface of the substrate, as shown in FIG. 2f, which exposes the NMOS and PMOS transistor regions. This mask is used for a threshold voltage implant which adjusts the threshold voltage of the NMOS and PMOS transistors as necessary, typically to between about |0.6| and |1.0|. In preferred embodiments, the threshold voltage implant is an implant of boron at a dose of between about $1 \times 10^{13}$ to $5 \times 10^{13}$ and preferably at 50 KeV. The boron and the up-diffusing p+ from the p-well set the threshold voltage for the NMOS transistor. The threshold voltage implant in conjunction with the n-well implant sets the PMOS threshold voltage. In preferred embodiments, the threshold voltage implant ultimately provides transistors with threshold voltages of 0.75±0.1 for NMOS and −0.85±0.1 for PMOS transistors.

Referring to FIG. 2g, the screen oxide then is stripped and a thin (on the order of 135 to 165 Å) gate oxide layer 170 is grown using means well known to those of skill in the art. This step may optionally be performed prior to the threshold voltage implants shown in FIG. 2f. A thin (on the order of 400 to 600 Å) layer of polysilicon 172 is then deposited on the thin gate oxide layer and a mask 174 is formed on the poly layer to define the NMOS and PMOS gates. A masked plasma etch removes the undesired poly from all regions of the substrate except those over the NMOS and PMOS gates. A wet etch is then used to remove the underlying oxide, as shown in FIG. 2h. Protection of the gate oxide from the photoresist by the thin poly layer provides MOS gates having far fewer defects since they are not exposed directly to photoresist.

As illustrated in FIG. 2i, another layer of intrinsic polysilicon 180 having a thickness of about 1,000 to 4,000 and preferably about 2,000 Å is deposited across the entire surface of the substrate. The devices are then masked with photoresist 184 to expose at least the base region of the bipolar transistor and the lightly doped regions of the resistors, as shown in FIG. 2j. In some embodiments, only the NMOS and PMOS transistor regions are protected by the mask. A base implant is then performed and the base is annealed. In preferred embodiments the base implant uses an energy of between about 30 and 100 keV, with an implant energy of between about 30 and 50 preferred. The dose of this implant is preferably about $3 \times 10^{13}$ and $8 \times 10^{13}$. In preferred embodiments the anneal is performed by heating the structure to 950° C. for 45 minutes, and results in a p-base region having a thickness of between about 1,000 and 2,000 Å with a dopant concentration of between about $1 \times 10^{18}$ and $1 \times 10^{19}/cm^3$, with a dopant concentration of about $5 \times 10^{18}/cm^3$ preferred.

Thereafter, as illustrated in FIG. 2k, a mask is formed which exposes bipolar emitter contact 84, and NMOS gates. The regions are doped n+ using an arsenic implant with an energy of about 100 keV to a concentration of between about $5 \times 10^{19}$ and $1 \times 10^{20}/cm^3$. As illustrated in FIG. 2l, the n+ mask is removed and another mask 188 is formed on the surface of the device to expose PMOS gates. The regions are preferably doped p+ to a concentration of between about $10^{18}$ and $10^{20}/cm^3$ with a dopant concentration of about $1 \times 10^{19}/cm^3$ preferred using boron. As discussed above, the PMOS and NMOS gates may be either n+ or p+ and thus may be included in either the n+ or p+ mask. The emitter region 30 is the polysilicon 84. It is to be understood that while the region 30 is referred to herein as the emitter, and the region 84 as the emitter contact, that those of skill in the art sometimes refer to the combination of regions 30 and 84 as the "emitter." No difference in meaning is intended herein.

In FIG. 2m, an oxide layer 190 having a thickness of between about 50 and 200 Å and a layer of nitride 192 having a thickness of between about 1,000 and 1,500 Å are deposited. The nitride layer prevents etch undercutting of the underlying polysilicon. The polysilicon layer 64 is then annealed at about 900° C. for a time of about 15 minutes. Next, a mask is formed on the surface of the nitride to protect the emitter of the bipolar transistor and the gate of the NMOS and PMOS transistors. A dry etch with chlorine chemistry results in the structure shown in FIG. 2n. The etch is conducted such that there is no residual polysilicon left over the field oxide regions.

The etch mask is removed and a photoresist mask 194 formed to expose the source and drain region 40 of the NMOS transistor, as shown in FIG. 2o. A lightly doped drain (LDD) implant is performed in which the source and the drain are lightly implanted with an n-type dopant such as phosphorus using an implant energy of between about 20 and 70 keV with implant energies of between about 20 and 40 keV preferred. This implant results in a net dopant concentration in the source and drain regions 40 which are self-aligned to the NMOS gate of between about $10^{17}$ and $10^{19}/cm^3$.

After the photoresist mask is removed and another mask 196 is formed, as illustrated in FIG. 2p, a p-type LDD using a dopant such as BF$_2$ is performed across the surface of the bipolar transistor and the PMOS transistor with the source and drain of the PMOS transistor and the base region of the bipolar transistor exposed by a mask. A p-region 32a which is self-aligned to the emitter is formed in the base of the bipolar transistor and a p-region 44 which is self-aligned to the gate is formed around the gate of the PMOS transistor. The resulting net dopant concentration in the regions 32a and 44 is between about $5 \times 10^{17}$ and $1 \times 10^{19}/cm^3$. The implant energy is preferably between about 40 and 60 keV.

As shown in FIG. 2q, an etch mask 200 is formed which protects all non-oxide surfaces except for one side of the base of the bipolar transistor. An etch is then conducted such that a trench 202 is created through the base and the n-type epitaxial layer to the buried layer 36 at about 0.4 μm below the original epitaxial surface. An optional n-type implant, as illustrated in FIG. 2r, may be performed in case any of the p-type epitaxial layer remains at the bottom of the trench. An optional p-type implant is performed using an implant energy of about 40 to 90 keV with a dose of between about $10^{11}$ and $10^{14}$ using BF$_2$. As shown in FIGS. 2q and 2r, the resulting structure has a single, unitary sidewall 201 which is self-aligned to the sidewall of the emitter contact and extends at least through the emitter and base regions of the device.

As illustrated in FIG. 2s, an oxide or glass layer is then grown on the surface to a thickness of about 100 Å using means well known to those skilled in the art. The oxide layer thickness is then increased by depositing an additional 2,500 to 5,000 Å thereon to form oxide layer 204. The oxide is then etched back leaving unitary oxide or glass spacers 81, 206 and 207 on the sidewalls of the bipolar emitter, the PMOS and NMOS gates and the trench, as illustrated in FIG. 2t. The bottom of the trench is etched to the buried layer to provide electrical contact with the collector. In an alternative embodiment, sidewall oxide is selectively formed on the sidewall of polysilicon according to the process disclosed in U.S. application Ser. No. 503,491 which is incorporated herein by reference for all purposes. In another alternative embodiment, a portion of the sidewall oxide spacer may be formed prior to etching the trench and the remaining portion of the sidewall oxide is formed after etching the trench.

A doped p-type polysilicon silicon layer 208 having a thickness of about 2,000 Å is then grown across the surface as shown in FIG. 2u. Mask 214 is formed over the surface exposing the bipolar collector contact, the NMOS source and drain contacts, and part of the PMOS drain contact, as shown in FIG. 2v. An n-type implant is performed as shown in FIG. 2w using an implant energy of about 30 to 50 keV with a dose of about $10^{16}$ using arsenic as a dopant. The resulting dopant concentration in the bipolar collector contact and the NMOS source and drain contacts is between about $10^{19}$ and $10^{20}/cm^3$.

The photoresist mask is removed and another mask 216 is formed exposing the resistor contacts, the bipolar emitter contact, and the PMOS source and drain contacts. A p-type implant is performed using an implant energy of about 20 to 50 keV with a dose of between about $6 \times 10^{14}$ and $6 \times 10^{15}$ using BF$_2$ as a dopant. The resulting dopant concentration in the bipolar base contact and the PMOS source and drain contacts is between about $6 \times 10^{17}$ and $5 \times 10^{18}/cm^3$.

As illustrated in FIG. 2y, the photoresist mask is removed and the surface is planarized using techniques known to those skilled in the art including but not limited to U.S. Pat. No. 4,745,087.

An etch mask 220 is then formed which allows etching of the polysilicon down to the oxide between the NMOS and PMOS transistors, as shown in FIG. 2z. Next, after the etch mask is removed, a layer of refractory metal such as titanium, molybdenum, tantalum, tungsten, or the like, is deposited across the surface of the device. Using means well known to those of skill in the art, the layer is heated to form metal silicide in regions where the deposited metal is in contact with polysilicon. Remaining unreacted metal is then etched away from the device.

The final steps in the fabrication sequence include depositing an oxide layer that is masked to provide contact holes therein. Metal is deposited on the surface of the device, masked, and etched from selected regions, providing the device shown in FIG. 1. In alternative embodiments the contact holes are filled with tungsten and etched back so as to form a planar surface before deposition of the metal interconnect layer.

The invention has now been described with reference to specific embodiments. Other embodiments will be apparent to those of ordinary skill in the art. For example, in an alternative embodiment which is not self-aligned, the trench, the spacers and the collector contact may be formed prior to forming the poly emitter contact. It is therefore not intended that this invention be limited, except as indicated in the appended claims.

What is claimed is:

1. A bipolar transistor comprising:
   a) a buried layer having a first conductivity type;
   b) a collector having a first conductivity type located above the buried layer;
   c) a base having a second conductivity type located above the collector;
   d) an emitter having a first conductivity type located above the base;
   e) an emitter contact having a first conductivity type located above the emitter;
   f) a trench extending along the emitter, base and collector;
   g) a first unitary contiguous dielectric sidewall to the emitter, base and collector in the trench;
   h) a base contact having a second conductivity type located above the base; and
   i) a second unitary contiguous dielectric sidewall located between the emitter contact and the base contact.

2. A bipolar transistor comprising:
   a) a collector region having a first conductivity type;
   b) a collector contact having a first conductivity type located above the collector;
   c) a base having a second conductivity type located above the collector region;
   d) a base contact having a second conductivity type located above the base;
   e) an emitter having a first conductivity type located above the base;
   f) an emitter contact of the first conductivity type located above the emitter;
   g) a trench extending along a sidewall of the emitter, base and collector; and
   h) a first unitary contiguous dielectric sidewall to the emitter, base and collector in the trench, wherein the first sidewall separates the collector and emitter contacts, and wherein said emitter contact is between the collector contact and the base contact.

3. A bipolar transistor comprising:
   a) a collector region having a first conductivity type;
   b) a collector contact having a first conductivity type located above the collector;
   c) a base having a second conductivity type located above the collector region;
   d) a base contact having a second conductivity type located above the base;
   e) an emitter having a first conductivity type located above the base;
   f) an emitter contact of the first conductivity type located above the emitter;
   g) a trench extending along a sidewall of the emitter, base and collector; and
   h) a first unitary contiguous dielectric sidewall to the emitter, base and collector in the trench, wherein the first sidewall separates the collector and emitter contacts, and wherein the emitter contact and the collector contact extend along the first dielectric sidewall.

4. A bipolar transistor comprising:
   a) a collector region having a first conductivity type;
   b) a collector contact having a first conductivity type located above the collector;
   c) a base having a second conductivity type located above the collector region;
   d) a base contact having a second conductivity type located above the base;
   e) an emitter having a first conductivity type located above the base;
   f) an emitter contact of the first conductivity type located above the emitter;
   g) a trench extending along a sidewall of the emitter, base and collector; and
   h) a first unitary contiguous dielectric sidewall to the emitter, base and collector in the trench, wherein the first sidewall separates the collector and emitter contacts, and wherein the emitter contact and collector contact abut the first dielectric sidewall.

5. A bipolar transistor comprising:
   a) a collector region having a first conductivity type;
   b) a collector contact having a first conductivity type located above the collector;
   c) a base having a second conductivity type located above the collector region;
   d) a base contact having a second conductivity type located above the base;
   e) an emitter having a first conductivity type located above the base;
   f) an emitter contact of the first conductivity type located above the emitter;
   g) a trench extending along a sidewall of the emitter, base and collector; and
   h) a first unitary contiguous dielectric sidewall to the emitter, base and collector in the trench, wherein the first sidewall separates the collector and emitter contacts, and wherein the base contact and emitter contact abut a second dielectric sidewall.

* * * * *